(12) United States Patent
Yeh et al.

(10) Patent No.: US 9,461,144 B2
(45) Date of Patent: Oct. 4, 2016

(54) METHOD FOR SEMICONDUCTOR DEVICE FABRICATION

(71) Applicant: Taiwan Semiconductor Manufacturing Company, Ltd., Hsin-Chu (TW)

(72) Inventors: Ming-Hsi Yeh, Hsinchu (TW); Hsin-Yan Lu, New Taipei (TW); Chao-Cheng Chen, Shin-Chu (TW); Syun-Ming Jang, Hsin-Chu (TW)

(73) Assignee: TAIWAN SEMICONDUCTOR MANUFACTURING COMPANY, LTD., Hsin-Chu (TW)

(*) Notice: Subject to any disclaimer, the term of this patent is extended or adjusted under 35 U.S.C. 154(b) by 159 days.

(21) Appl. No.: 14/303,822

(22) Filed: Jun. 13, 2014

(65) Prior Publication Data

US 2015/0364573 A1   Dec. 17, 2015

(51) Int. Cl.
| | |
|---|---|
| *H01L 29/66* | (2006.01) |
| *H01L 21/311* | (2006.01) |
| *H01L 21/8234* | (2006.01) |
| *H01L 21/02* | (2006.01) |
| *H01L 29/51* | (2006.01) |
| *H01L 21/28* | (2006.01) |
| *H01L 29/78* | (2006.01) |

(Continued)

(52) U.S. Cl.
CPC ... *H01L 29/66545* (2013.01); *H01L 21/02054* (2013.01); *H01L 21/28017* (2013.01); *H01L 21/31116* (2013.01); *H01L 21/823462* (2013.01); *H01L 29/0847* (2013.01); *H01L 29/517* (2013.01); *H01L 29/66606* (2013.01); *H01L 29/7834* (2013.01); *H01L 29/4966* (2013.01); *H01L 29/66636* (2013.01)

(58) Field of Classification Search
CPC .......... H01L 29/66545; H01L 29/517; H01L 29/495; H01L 21/31116; H01L 21/28088; H01L 21/28079; H01L 21/823462; H01L 21/02054; H01L 21/324; H01L 29/66606; H01L 29/66636
See application file for complete search history.

(56) References Cited

U.S. PATENT DOCUMENTS

| | | | | |
|---|---|---|---|---|
| 5,505,816 A | * | 4/1996 | Barnes | H01L 21/31116 257/E21.252 |
| 7,732,346 B2 | | 6/2010 | Hsu et al. | |
| 8,048,733 B2 | * | 11/2011 | Yeh | H01L 29/7833 257/E21.632 |

(Continued)

OTHER PUBLICATIONS

Office Action mailed Dec. 2, 2015, issued by the Korean Patent Office in Korean Patent Application No. 10-2014-0177640, 10 pages.

*Primary Examiner* — Michael Trinh
(74) *Attorney, Agent, or Firm* — Haynes and Boone, LLP (57) ABSTRACT

A method of forming a semiconductor device is disclosed. The method includes exposing a dummy oxide layer of a gate structure to a vapor mixture comprising $NH_3$ and a fluorine-containing compound at a first temperature, wherein the dummy oxide layer is formed over a substrate and surrounded by a gate spacer that includes a material different from that of the dummy oxide layer. The method further includes rinsing the substrate with a solution containing de-ionized water (DIW) at a second temperature. The method may further include baking the substrate in a chamber heated to a third temperature higher than the first and second temperatures. The exposing, rinsing, and baking steps remove the dummy oxide layer thereby forming an opening in the gate spacer. The method may further include forming a gate stack having a high-k gate dielectric layer and a metal gate electrode in the opening.

20 Claims, 6 Drawing Sheets

(51) Int. Cl.
*H01L 29/08* (2006.01)
*H01L 29/49* (2006.01)

(56) References Cited

U.S. PATENT DOCUMENTS

| | | | |
|---|---|---|---|
| 8,252,194 B2* | 8/2012 | Kiehlbauch | H01L 21/31116 216/62 |
| 8,361,855 B2 | 1/2013 | Yeh et al. | |
| 8,415,254 B2* | 4/2013 | Yeh | H01L 21/02071 134/1.3 |
| 8,586,436 B2 | 11/2013 | Ng et al. | |
| 2002/0072016 A1* | 6/2002 | Chen | G03F 7/427 430/323 |
| 2006/0183055 A1 | 8/2006 | O'Neill et al. | |
| 2006/0196527 A1 | 9/2006 | Nishimura et al. | |
| 2008/0258216 A1 | 10/2008 | Kikuchi | |
| 2012/0273773 A1 | 11/2012 | Ieda et al. | |
| 2013/0320455 A1 | 12/2013 | Cappellani et al. | |

* cited by examiner

METHOD FOR SEMICONDUCTOR DEVICE FABRICATION

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

One advancement implemented as technology nodes shrink, in some IC designs, has been the replacement of the typically polysilicon gate electrode with a metal gate electrode to improve device performance with the decreased feature sizes. One process of forming a metal gate stack is termed a replacement or "gate-last" process in which the final gate stack is fabricated "last" which allows for reduced number of subsequent processes, including high temperature processing, that must be performed after formation of the gate. However, there are challenges to implementing such IC fabrication processes, especially with scaled down IC features in advanced process nodes, such as N20, N16 and beyond.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is generally related to methods for semiconductor device fabrication, and more particularly to methods of removing a dummy oxide layer in a gate-last process. In a typical gate-last process for manufacturing a field effect transistor (FET), first, a dummy oxide layer and a dummy gate electrode are formed over a substrate as a placeholder for an actual gate stack. Then more features are formed over the substrate, such as source/drain regions, a gate spacer surrounding the dummy oxide layer and the dummy gate electrode, and an interlayer dielectric (ILD) layer surrounding the gate spacer. Subsequently, the dummy gate electrode is removed to form an opening in the gate spacer and to expose the dummy oxide layer through the opening. Another step is performed to remove the dummy oxide layer through the opening so as to expose the substrate for forming the actual gate stack thereon. However, problems arise when removing the dummy oxide layer with typical wet and/or dry etch processes. During a wet etch process, top portions of the ILD layer are isotropically removed leaving a plurality of recesses in the ILD layer. This is due to the use of hydrofluoric (HF) acid in the wet etch process, and the opening limits entrance of the HF acid into interior surface of the opening. Thus, less HF acid reaches bottom of the opening and more of the ILD layer reacts. During a dry (plasma) etching process, the substrate underneath the dummy oxide layer may be accidentally recessed as a result of the removal of the dummy oxide layer. The recesses in the ILD layer and/or the substrate are problematic in various respects. For example, the recesses present in the substrate may change dopant distribution in channel regions of the FET. Thus, performance characteristics such as threshold voltage and reliability may degrade. For another example, the recesses present in the ILD layer can become a receptacle of metals during subsequent processing thereby increasing the likelihood of electrical shorting and/or device failure.

U.S. Pat. No. 8,361,855 entitled "Method for Fabricating a Gate Structure" by Matt Yeh et al., the contents of which are hereby incorporated by reference in its entirety, discloses a method of removing the dummy oxide layer using a gas etching process followed by a process of heating the substrate to a high temperature, which overcomes the above shortcomings associated with typical wet and/or dry etch processes. However, in view of the continued scaling down process and increased fabrication quality target, improvements in this area are still desirable. For example, in advanced process nodes such as N20, N16, and smaller nodes, any residuals or particulates on the substrate as a result of the dummy oxide removal process might be hazardous to the IC fabrication. For example, a particulate on the bottom of a gate opening may be amplified as a bump in the actual gate stack when layers of the gate stack are subsequently formed over the particulate, causing defects in the IC. The present disclosure provides embodiments of a method of removing the dummy oxide layer substantially free of any residuals or particulates in the gate opening, while avoiding ILD/substrate recess issues associated with typical wet and/or dry etch processes.

Figure 1:
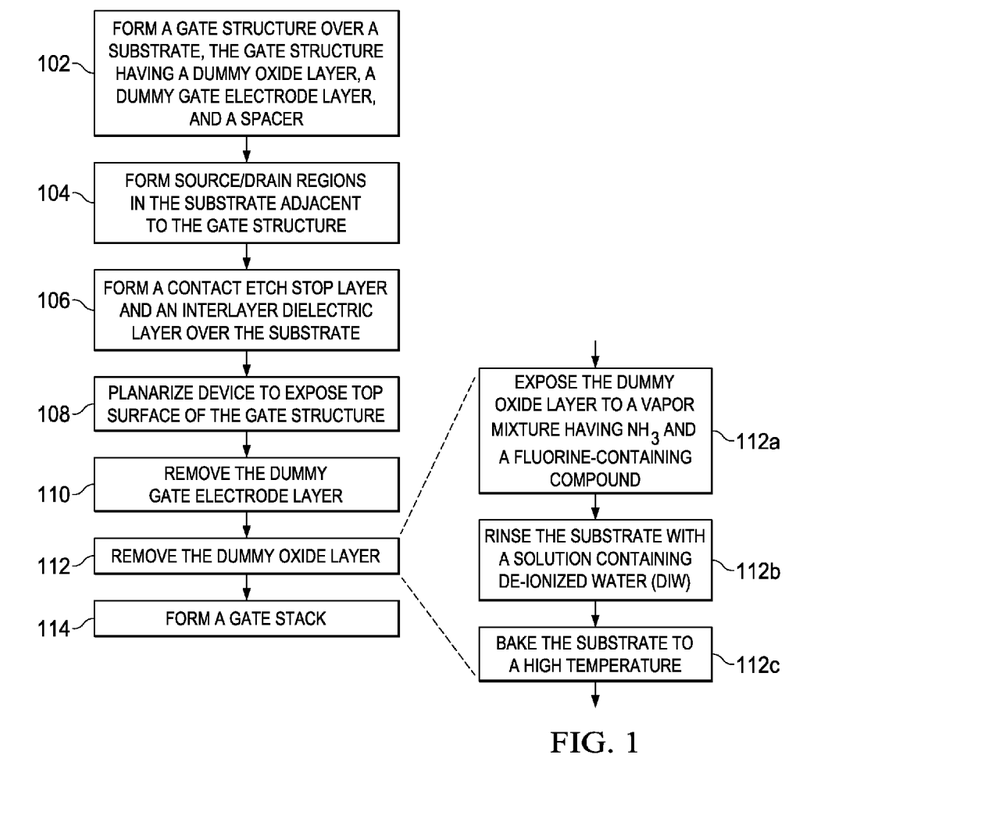
FIG. 1 is a block diagram of a method of forming a semiconductor device, according to various aspects of the present disclosure.

Referring to FIG. 1, shown therein is a method 100 of forming a semiconductor device according to various aspects of the present disclosure. The method 100 is an example, and is not intended to limit the present disclosure beyond what is explicitly recited in the claims. Additional operations can be provided before, during, and after the method 100, and some operations described can be replaced, eliminated, or moved around for additional embodiments of the method. The method 100 is described below in conjunction with FIGS. 2-10 which are cross-sectional views of a device 200 according to various aspects of the present disclosure.

As will be shown, the device 200 illustrates a field effect transistor (FET) in one region of a substrate. This is provided for simplification and ease of understanding and does not necessarily limit the embodiments to any types of devices, any number of devices, any number of regions, or any configuration of structures of regions. Furthermore, the device 200 may be an intermediate device fabricated during processing of an IC, or a portion thereof, that may comprise static random access memory (SRAM) and/or other logic circuits, passive components such as resistors, capacitors, and inductors, and active components such as p-type FETs (PFETs), n-type FETs (NFETs), FinFETs, metal-oxide semiconductor field effect transistors (MOSFET), complementary metal-oxide semiconductor (CMOS) transistors, bipolar transistors, high voltage transistors, high frequency transistors, other memory cells, and combinations thereof.

Figure 2:
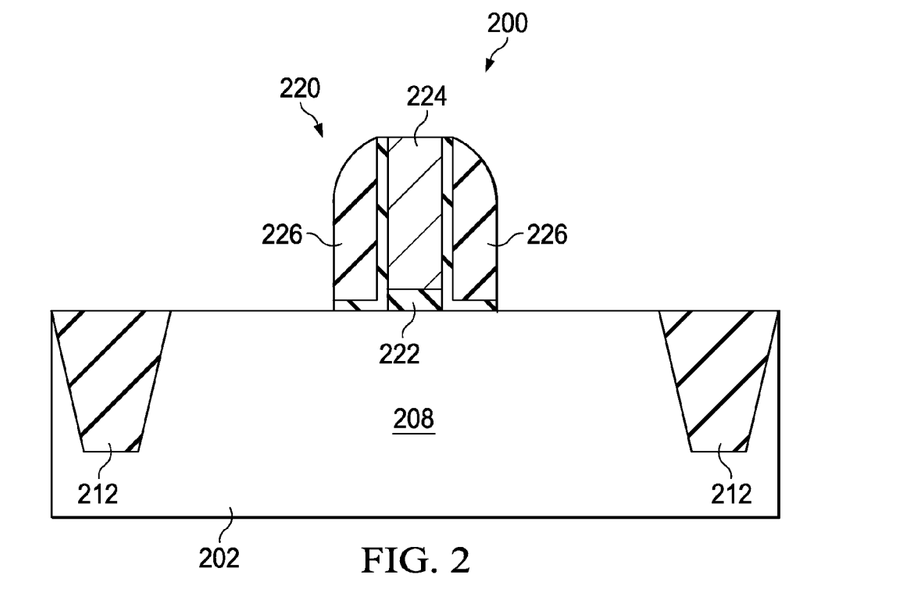
FIGS. 2-10 illustrate cross sectional views of forming a target semiconductor device according to the method of FIG. 1, in accordance with an embodiment.

The method 100 (FIG. 1) forms a gate structure 220 over a substrate 202 (FIG. 2) at operation 102. Referring to FIG. 2, the substrate 202 is a silicon substrate in the present embodiment. Alternatively, the substrate 202 may comprise another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In yet another alternative, the substrate 202 is a semiconductor on insulator (SOI).

The substrate 202 includes a region 208 that is isolated from other portions of the substrate 202 by isolation structures 212. In an embodiment, the region 208 is a p-type field effect transistor region, such as an n-well in a p-type substrate, for forming a PFET. In another embodiment, the region 208 is an n-type field effect transistor region for forming an NFET.

The isolation structures 212 may be formed of silicon oxide, silicon nitride, silicon oxynitride, fluoride-doped silicate glass (FSG), a low-k dielectric material, and/or other suitable insulating material. The isolation structures 212 may be shallow trench isolation (STI) features. In an embodiment, the isolation structures 212 are STI features and are formed by etching trenches in the substrate 202. The trenches may then be filled with isolating material, followed by a chemical mechanical planarization (CMP) process. Other isolation structures 212 such as field oxide, LOCal Oxidation of Silicon (LOCOS), and/or other suitable structures are possible. The isolation structures 212 may include a multi-layer structure, for example, having one or more liner layers.

The gate structure 220 includes a gate stack that includes a dummy oxide layer 222 and a dummy gate electrode layer 224. The dummy oxide layer 222 may include a dielectric material such as silicon oxide ($SiO_2$) or nitrogen (N) doped $SiO_2$. The dummy oxide layer 222 may be formed by chemical oxidation, thermal oxidation, atomic layer deposition (ALD), chemical vapor deposition (CVD), and/or other suitable methods. For example, the dummy oxide layer 222 can be grown by a rapid thermal oxidation (RTO) process or in an annealing process comprising oxygen. The dummy gate electrode layer 224 may comprise a single layer or multilayer structure. In an embodiment, the dummy gate electrode layer 224 comprises poly-silicon. Further, the dummy gate electrode layer 224 may be doped poly-silicon with the same or different doping. The dummy gate electrode layer 224 may be formed by suitable deposition processes such as low-pressure chemical vapor deposition (LPCVD) and plasma-enhanced CVD (PECVD). In an embodiment, the dummy oxide layer 222 and the dummy gate electrode layer 224 are first deposited as blanket layers over the substrate 202. Then the blanket layers are patterned through a process including photolithography processes and etching processes thereby removing portions of the blanket layers and keeping the remaining portions over the substrate 202 as the dummy oxide layer 222 and the dummy gate electrode layer 224. In some embodiments, the gate structure 220 may include additional dielectric layers and/or conductive layers. For example, the gate structure 220 may include hard mask layers, interfacial layers, capping layers, diffusion/barrier layers, other suitable layers, and/or combinations thereof.

The gate structure 220 further includes a gate spacer 226 surrounding the dummy oxide layer 222 and the dummy gate electrode layer 224 along sidewalls thereof. The gate spacer 226 includes a material different from that of the dummy oxide layer 222. In an embodiment, the gate spacer 226 includes a nitrogen-containing dielectric material, such as silicon nitride, silicon oxynitride, other nitrogen-containing dielectric material, or combination thereof. In an example, the gate spacer 226 includes two layers and is formed by blanket depositing a first dielectric layer as a liner layer over the device 200 and a second dielectric layer as a main D-shaped spacer over the first dielectric layer, and then, anisotropically etching to remove portions of the dielectric layers to form the gate spacer 226 as illustrated in FIG. 2. In some embodiments, the gate structure 220 may include a seal layer between the dummy gate stack 222/224 and the gate spacer 226.

Figure 3:
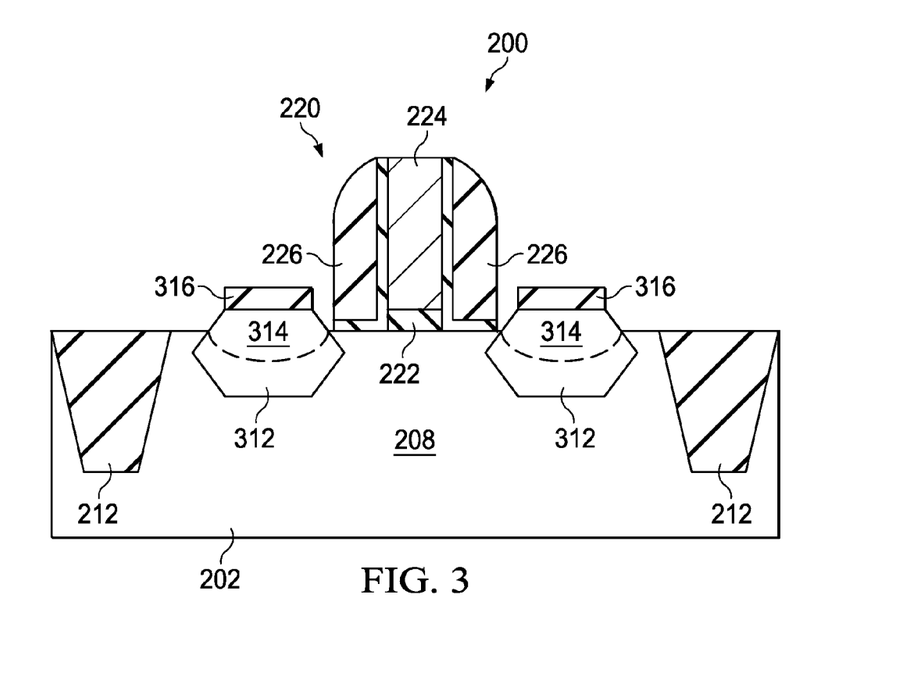

The method 100 (FIG. 1) proceeds to operation 104 to form source and drain regions in the substrate 202 adjacent to the gate structure 220. The source and drain regions may be formed by a variety of processes. Referring to FIG. 3, in the present embodiment, the source and drain regions each include a lightly doped source/drain (LDD) 312, a heavily doped source/drain (HDD) 314, and a silicidation 316.

In an embodiment, the LDD 312 is formed by a process that includes an etching process, a cleaning process, and an epitaxy process. For example, the etching process removes portions of the substrate 202 adjacent to the gate structure 220 thereby forming two recesses sandwiching the gate structure 220; the cleaning process clean the recesses with a hydrofluoric acid (HF) solution or other suitable solution; and the epitaxy process performs a selective epitaxial growth (SEG) process thereby forming an epitaxial layer 312 in the recesses. The etching process may be a dry etch process, a wet etch process, or a combination thereof. In an embodiment, the SEG process is a low pressure chemical vapor deposition (LPCVD) process using a silicon-based precursor gas. Further, the SEG process may in-situ dope the epitaxial layer 312 with a p-type dopant for forming a PFET or an n-type dopant for forming a NFET. If the epitaxial layer 312 is not doped during the SEG process, it may be doped in a subsequent process, for example, by an ion implantation process, plasma immersion ion implantation (PIII) process, gas and/or solid source diffusion process, other process, or a combination thereof. An annealing process, such as a rapid thermal annealing and/or a laser thermal annealing, may be performed to activate dopants in the epitaxial layer 312. In an embodiment, the HDD 314 may be formed by a process that includes an etch-back process and an epitaxy process. For example, the etch-back process selectively etches the epitaxial layer 312 to remove portions thereof with a dry etch process, a wet etch process, or combination thereof; and the epitaxy process uses a process similar to that forms the LDD 312 but using heavier dopants. An annealing process, such as a rapid thermal annealing and/or a laser thermal annealing, may be performed to activate dopants in the epitaxial layer 314. The silicidation 316 may include nickel silicide (NiSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), other suitable conductive materials, and/or combinations thereof. The silicidation 316 may be formed by a process that includes depositing a metal layer, annealing the metal layer such that the metal layer is able to react with silicon to form silicide, and then removing the non-reacted metal layer.

In various embodiments of the present disclosure, the source/drain regions 312/314/316 or portions thereof may be formed by a variety of other processes. For example, the source/drain regions may be formed by a halo or lightly doped drain (LDD) implantation, source/drain implantation, source/drain activation and/or other suitable processes. Furthermore, in some embodiments, portions of the source/drain regions, such as the LDD 312, may be formed before the gate spacer 226 is formed and remaining portions of the source/drain regions are formed after the gate spacer 226 is formed.

Figure 4:
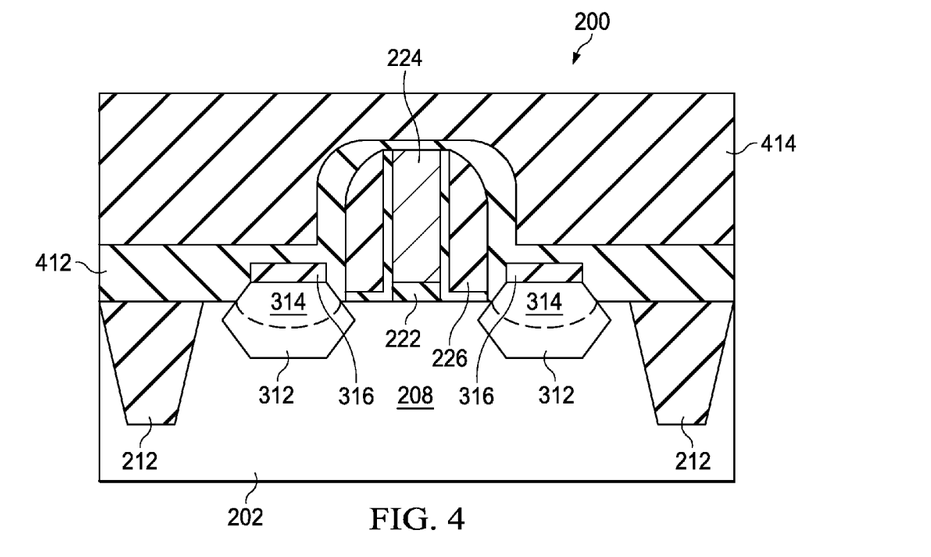

The method 100 (FIG. 1) proceeds to operation 106 to form a contact etch stop layer (CESL) 412 and an interlayer dielectric (ILD) layer 414 over the gate structure 220 and over the substrate 202 (FIG. 4). Examples of materials that may be used to form the CESL 412 include silicon nitride, silicon oxynitride, silicon nitride with few oxygen (O) or carbon (C) elements, and/or other materials. The CESL 412 may be formed by PECVD process and/or other suitable deposition or oxidation processes. For example, the CESL 412 may include silicon nitride (e.g., SiN) formed by a PECVD mixed frequency process. The ILD layer 414 may include materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. In some embodiments, the ILD layer 318 may include a high density plasma (HDP) dielectric material (e.g., HDP oxide) and/or a high aspect ratio process (HARP) dielectric material (e.g., HARP oxide). The ILD layer 414 may be deposited by a PECVD process or other suitable deposition technique. In an embodiment, prior to the formation of the CESL 412 and the ILD layer 414, a partial removal of the gate spacer 226 may be performed to reduce the thickness thereof.

Figure 5:
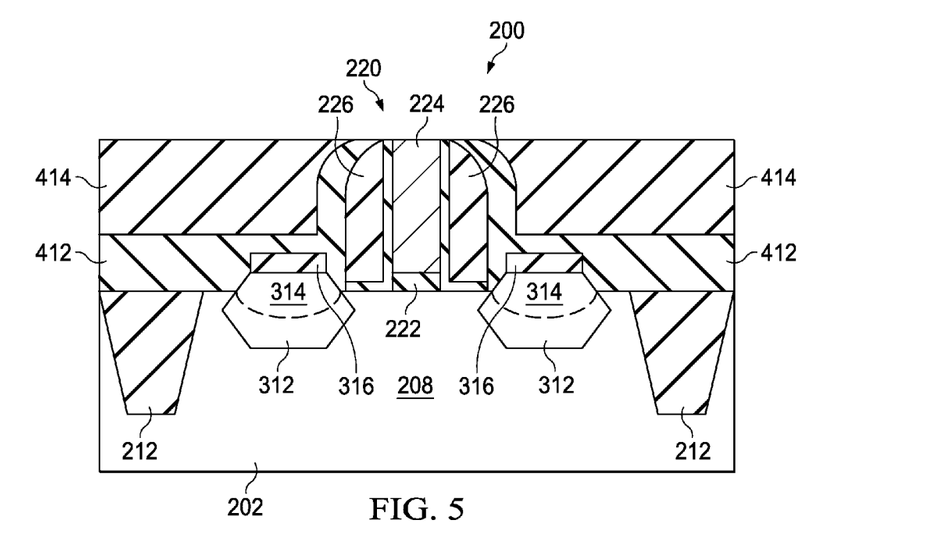

The method 100 (FIG. 1) proceeds to operation 108 to planarize the CESL 412 and the ILD layer 414 to expose a top surface of the gate structure 220. Referring to FIG. 5, the dummy gate electrode layer 224 is exposed by operation 108. In an embodiment, operation 108 includes a chemical mechanical planarization (CMP) process.

Figure 6:
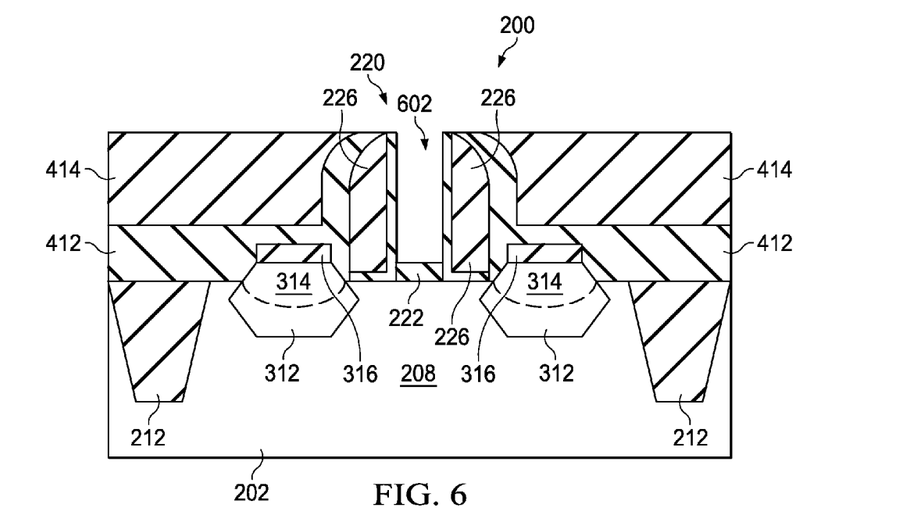

The method 100 (FIG. 1) proceeds to operation 110 to remove the dummy gate electrode layer 224 from the gate structure 220. The dummy gate electrode layer 224 can be removed with a suitable wet etch, dry (plasma) etch, and/or other processes. In an embodiment, the dummy gate electrode layer 224 comprises poly-silicon and the wet etch process for removal thereof includes exposure to a hydroxide solution containing ammonium hydroxide, diluted HF, deionized water, and/or other suitable etchant solutions. In another embodiment, the dummy gate electrode layer 224 comprises poly-silicon and the dry etch process for removal thereof may be performed under a source power of about 650 to 800 W, a bias power of about 100 to 120 W, and a pressure of about 60 to 200 mTorr, using $Cl_2$, HBr and He as etching gases. Referring to FIG. 6, in the present embodiment, the dummy gate electrode layer 224 and any other layer(s) (not shown) are removed by operation 110 (FIG. 1) thereby forming an opening 602 in the gate spacer 226. The opening 602 exposes a top surface of the dummy oxide layer 222. In some embodiments, during operation 110, certain regions of the IC may be covered by a hard mask layer so that those regions are protected from the etching process while the dummy gate electrode layer 224 is removed.

The method 100 (FIG. 1) proceeds to operation 112 to remove the dummy oxide layer 222. In the present embodiment, operation 112 includes three sub-operations 112a, 112b, and 112c, which are described in detail below.

Figure 7:
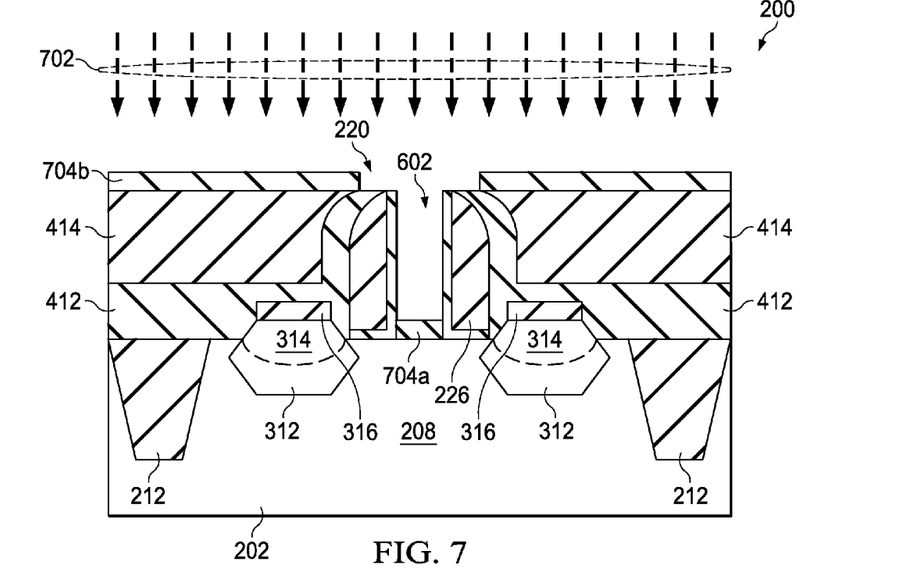

In operation 112a, the method 100 (FIG. 1) exposes the dummy oxide layer 222 to a vapor mixture 702 in a sealed gas etching chamber. Referring to FIG. 7, the device 200 is placed into the sealed gas etching chamber and the vapor mixture 702 is introduced into the chamber. The vapor mixture 702 reacts with the dummy oxide layer 222 and a portion of the ILD layer 414 thereby forming reaction products 704a and 704b respectively. The reaction process is self-limiting, in that amount of material reacted is determined by amount of the vapor mixture 702 introduced into the gas etching chamber. In some embodiments, the vapor mixture 702 comprising $NH_3$ and a fluorine-containing compound. It is believed that one of the vapor mixture components functions as a catalyst and the other component functions an etchant. In some embodiments, the fluorine-containing compound may be a compound selected from the group consisting of HF and $NF_3$. In an embodiment, the vapor mixture 702 comprises $NH_3$ and HF. The vapor mixture of $NH_3$ and HF comprises a ratio of $NH_3$ to HF between about 0.1 to about 10, such as a ratio of 1 part $NH_3$ to 1 part HF by volume. Furthering this embodiment, operation 112a is performed at a pressure ranging from about 10 mTorr to about 25 mTorr and at a temperature ranging from about 20° C. to about 70° C. In another embodiment, the vapor mixture 702 comprises $NH_3$ and $NF_3$. The vapor mixture of $NH_3$ and $NF_3$ comprises a ratio of $NH_3$ to $NF_3$ from about 0.5 to 5, such as a ratio of 2 parts $NH_3$ to 1 part $NF_3$ by volume. Furthering this embodiment, operation 112a is performed at a pressure ranging from about 2 Torr to about 4 Torr and at a temperature ranging from about 20° C. to about 70° C. In various embodiments, operation 112a is performed for about 10 seconds to about 600 seconds, depending on the thickness of the dummy oxide layer 222.

While the mechanism of the reaction does not affect the scope of the claims, it is believed that, in some embodiments, the reaction process is a multiple step process. For example, during a first step, a blanket adsorbed reactant film of the vapor mixture 702 may be formed over the top surface of the dummy oxide layer 222 and the surface of the dielectric layers including the gate spacer 226, CESL 412, and ILD layer 414. During a second step, the adsorbed reactant film may react with the top surface of the dummy oxide layer 222 in contact therewith to form a first condensed and solid reaction product 704a beneath the adsorbed reactant film, for example, according to the following formula:

$$6HF+NH_4+SiO_2 \rightarrow (NH_4)_2SiF_6+H_2O \tag{1}$$

The adsorbed reactant film may also react with the top surface of the ILD layer 414 in contact therewith to form a second condensed and solid reaction product 704b beneath the adsorbed reactant film. The adsorbed reactant film may not or less react with the surface of the gate spacer 226 and CESL 412 in contact therewith beneath the adsorbed reactant film.

Figure 8:
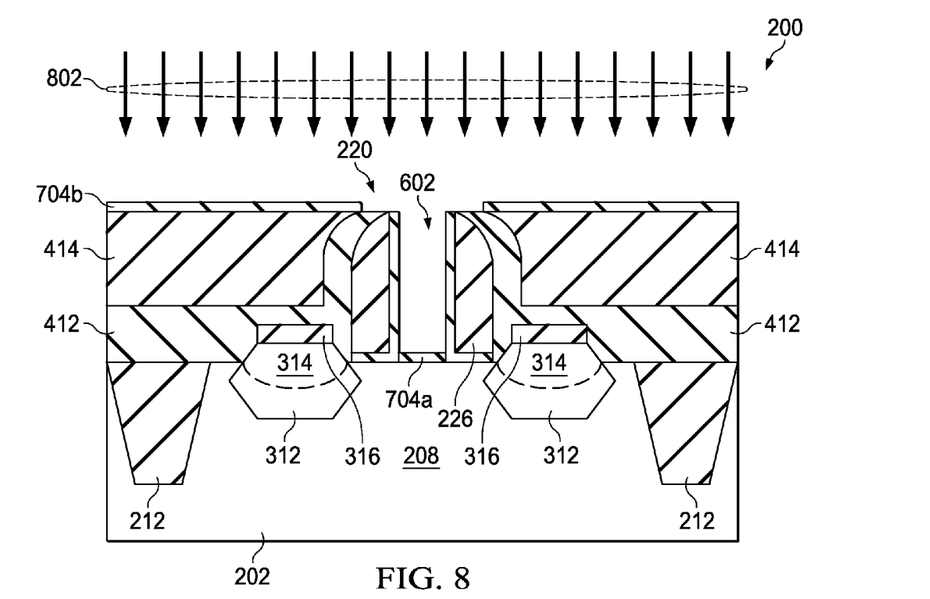

In operation 112b, the method 100 (FIG. 1) rinses the substrate 202 including the device 200 with a solution 802 containing de-ionized water (DIW). Referring to FIG. 8, operation 112b may be performed in a sealed wet rinsing chamber. In an embodiment, the solution 802 includes DIW and a chemical to form a light acidic solution. For example, the chemical may be carbon dioxide ($CO_2$), diluted hydrochloric acid (HCl), or diluted citric acid. In an embodiment, the solution 802 is slightly acidic and has a pH value ranging from about 3 to about 7. This acidic solution is effective for removing chemical residues which may include an alkali residue. In another embodiment, the solution 802 is simply DIW. The operation 112b is performed at a temperature ranging from about 20° C. to about 80° C. In various embodiments, operation 112b is performed for about 10 seconds to about 600 seconds, depending on the thickness of the solid reaction products 704a and 704b. It is believed that the solution 802 and the rinsing process may partially or completely remove the adsorbed reactant film and the solid reaction products 704a and 704b. For example, $(NH_4)_2SiF_6$, believed to comprise the solid reaction products 704a and 704b, can be dissolved in DIW. For example, in some embodiments, operation 112b may at least partially remove the solid reaction products 704a and 704b off of the substrate 202. In some embodiments, operation 112b may change density of the solid reaction products 704a and 704b so that they become easier to remove in a subsequent baking step.

In some embodiments, the operation 112b further includes a process of drying the substrate 202 after it is rinsed. In an embodiment, a spin drying process is used to dry the substrate 202. For example, the substrate 202 is spun while it is being blown with a flow of an inert gas such as $N_2$ or other inactive gases. For example, the substrate 202 may be spun at a rate of about 2,500 rpm although other spin rates may be used. The centrifugal forces and the flow of the inert gas remove from the surface of the substrate 202 any residuals of the solution 802. In another embodiment, an isopropyl alcohol (IPA) drying process is used to dry the substrate 202. For example, hot vapor of IPA may be introduced into the wet rinsing chamber where the substrate 202 is received. The IPA displaces the solution 802 from the surface of the substrate 202. Then the IPA evaporates during a cooling process, leaving the substrate 202 moisture-free.

Figure 9:
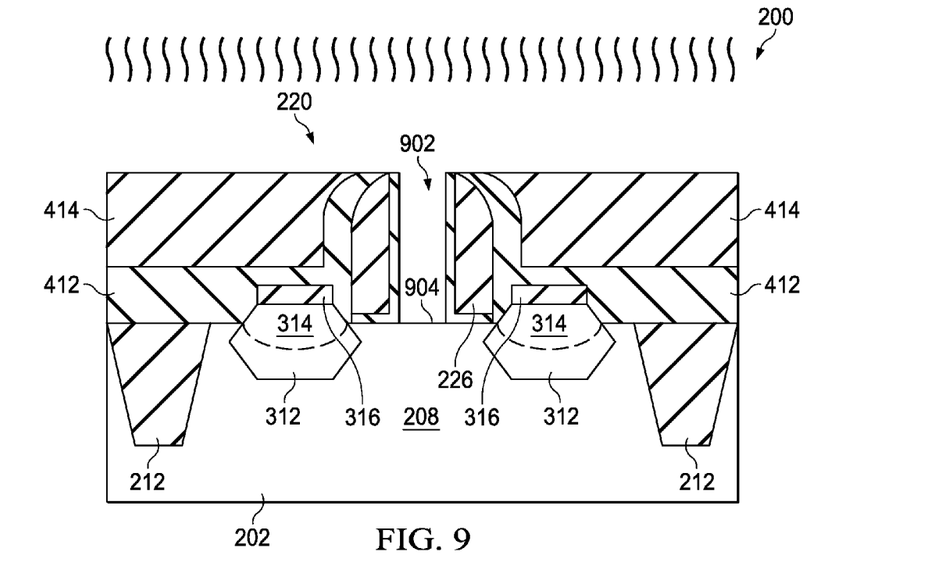

In operation 112c, the method 100 (FIG. 1) bakes the substrate 202 to a high temperature to cause sublimation of any remaining portions of the adsorbed reactant film and the solid reaction products 704a and 704b. Referring to FIG. 9, in embodiments, operation 112c is performed in a sealed baking chamber at a pressure ranging from about 10 mTorr to about 25 mTorr. In some embodiments, the baking chamber may be heated to a temperature ranging from about 90° C. to about 200° C. In some embodiments, the substrate 202 is heated while a carrier gas is blown over the substrate 202 to remove the sublimation products from the baking chamber. In some embodiments, the carrier gas is an inert gas such as N2, He, Ar, or a mixture thereof. In various embodiments, operation 112b may be performed for about 10 seconds to about 600 seconds. The operation 112c further cleans the substrate 202 in case that the operation 112b has not completely removed the reaction products and residuals from the operation 112a.

In some embodiments, the operations 112a, 112b, and 112c are each performed in a separate chamber. Alternatively, the three operations may be performed in three chambers of a cluster tool. For example, the substrate 202 is first received in a gas etching chamber where the operation 112a is performed. Subsequently, the substrate 202 is moved by a robot from the gas etching chamber to a wet rinsing chamber where the operation 112b is performed. Finally, the substrate 202 is moved by a robot from the wet rinsing chamber to a baking chamber where the operation 112c is performed. Using a cluster tool reduces timing gap between operations and reduces the possibility that the substrate 202 may be exposed and contaminated during the dummy oxide removal process.

After the operation 112 (FIG. 1) has completed, the dummy oxide layer 222 is completely removed from the gate structure 220 thereby forming an opening 902 therein (FIG. 9). The opening 902 is surrounded by the gate spacer 226. A top surface 904 of the substrate 202 is exposed through the opening 902 and is substantially free of any recesses and/or residuals, achieving cleanliness for improved IC fabrication quality and circuit performance. In embodiments, a ratio of removal rates by the vapor mixture 702 of the dummy oxide layer 222 and the substrate 202 is greater than 100. Therefore, the method 100 for fabricating a gate structure creates almost no recess in the substrate 202, overcoming the substrate recess issues associated with traditional dry etch processes discussed above. Meanwhile, the ILD layer 414 may be partially removed by the operation 112 because the gas etching process (operation 112a) has almost no selectivity for the dummy oxide layer 222 and the ILD layer 414. In some embodiments, the ILD layer 414 may lose almost the same thickness as the dummy oxide layer 222 does. However, that is only a small portion, e.g., less than 1%, of the ILD layer 414. Therefore, the method 100 for fabricating a gate structure creates almost no recess in the ILD layer 414, overcoming the ILD loss issues associated with traditional wet and/or dry etch process discussed above. Furthermore, the CESL 412 and the gate spacer 226 remain substantially unchanged through the operation 112, maintaining a desirable profile for further gate stack formation. In an embodiment, a ratio of removal rates by the vapor mixture 702 of the dummy oxide layer 222 and the gate spacer 226 is greater than 2.

Figure 10:
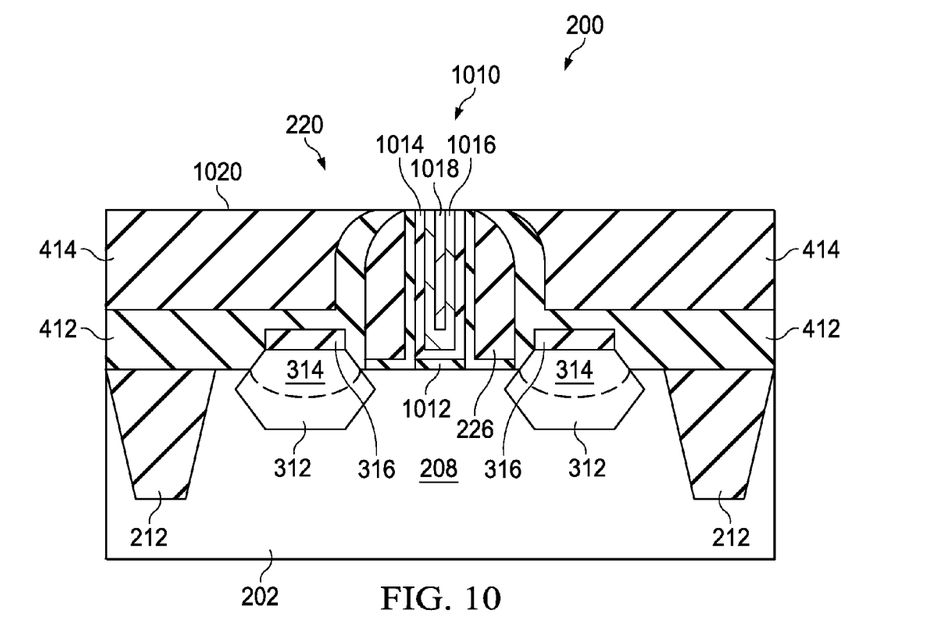

The method 100 (FIG. 1) proceeds to operation 114 to form a gate stack 1010 in the opening 902. Referring to FIG. 10, in the present embodiment, the gate stack 1010 includes an interfacial layer 1012, a dielectric layer 1014, a work function metal layer 1016, and a fill layer 1018. The interfacial layer 1012 may include a dielectric material such as silicon oxide layer ($SiO_2$) or silicon oxynitride (SiON), and may be formed by chemical oxidation, thermal oxidation, atomic layer deposition (ALD), CVD, and/or other suitable dielectric. The dielectric layer 1014 may include a high-k dielectric layer such as hafnium oxide ($HfO_2$), $Al_2O_3$, lanthanide oxides, $TiO_2$, HfZrO, $Ta_2O_3$, $HfSiO_4$, $ZrO_2$, $ZrSiO_2$, combinations thereof, or other suitable material. The dielectric layer 1014 may be formed by ALD and/or other suitable methods. The work function metal layer 1016 may be a p-type or an n-type work function layer. Exemplary p-type work function metals include TiN, TaN, Ru, Mo, Al, WN, $ZrSi_2$, $MoSi_2$, $TaSi_2$, $NiSi_2$, WN, other suitable p-type work function materials, or combinations thereof. Exemplary n-type work function metals include Ti, Ag, TaAl, TaAlC, TiAlN, TaC, TaCN, TaSiN, Mn, Zr, other suitable n-type work function materials, or combinations thereof. The work function layer 1016 may include a plurality of layers and may be deposited by CVD, PVD, and/or other suitable process. The fill layer 1018 may include aluminum (Al), tungsten (W), cobalt (Co), copper (Cu), and/or other suitable materials. The fill layer 1018 may be formed by CVD, PVD, plating, and/or other suitable processes. The gate stack 1010 fills the opening 902 (FIG. 9) of the gate structure 220. A CMP process may be performed to remove excess materials from the gate stack 1010 and to planarize a top surface 1020 of the device 200. Further operations, such as contact and via formation, interconnect processing, etc., may be performed subsequently to complete the device 200 fabrication.

Although not intended to be limiting, one or more embodiments of the present disclosure provide many benefits to a semiconductor device and the formation thereof. For example, a semiconductor device thus formed is substantially free of defects associated with ILD oxide loss and substrate material loss in a typical gate-last formation process. For example, a FinFET device formed with embodiments of the present disclosure will have desirable fin height and will preserve oxide material in its isolation structures. For example, a FET device formed with embodiments of the present disclosure will have desirable gate profile and improved threshold voltage.

In one exemplary aspect, the present disclosure is directed to a method of forming a semiconductor device. The method includes exposing a dummy oxide layer of a gate structure to a vapor mixture comprising $NH_3$ and a fluorine-containing compound at a first temperature, wherein the dummy oxide layer is formed over a substrate and surrounded by a gate spacer that includes a material different from that of the dummy oxide layer. The method further includes rinsing the substrate with a solution containing de-ionized water (DIW) at a second temperature.

In another exemplary aspect, the present disclosure is directed to a method of forming a semiconductor device. The method includes providing a substrate, wherein the substrate includes a dummy oxide layer and a nitrogen-containing dielectric layer surrounding the dummy oxide layer. The method further includes exposing the dummy oxide layer to a vapor mixture comprising $NH_3$ and a fluorine-containing compound at a first temperature thereby converting the dummy oxide layer to a reaction product. The method further includes rinsing the substrate with a solution containing de-ionized water (DIW) at a second temperature to at least partially remove the reaction product from the substrate. The method further includes heating the substrate to a third temperature higher than the first and second temperatures to cause sublimation of the reaction product thereby forming an opening in the nitrogen-containing dielectric layer.

In another exemplary aspect, the present disclosure is directed to a method of forming a semiconductor device. The method includes forming a gate structure over a substrate, wherein the gate structure includes a dummy oxide layer, a dummy gate electrode layer over the dummy oxide layer, and a nitrogen-containing dielectric layer surrounding the dummy oxide layer and the dummy gate electrode layer. The method further includes removing the dummy gate electrode layer thereby exposing the dummy oxide layer. The method further includes exposing the dummy oxide layer to a vapor mixture comprising $NH_3$ and a fluorine-containing compound at a first temperature; rinsing the substrate with a solution containing de-ionized water (DIW) at a second temperature; and heating the substrate to a third temperature higher than the first and second temperatures, thereby forming an opening in the nitrogen-containing dielectric layer. The method further includes forming a gate stack, the gate stack at least partially occupying the opening.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, comprising the steps of:
    exposing a dummy oxide layer of a gate structure to a vapor mixture comprising $NH_3$ and a fluorine-containing compound at a first temperature thereby converting the dummy oxide layer to a reaction product, the dummy oxide layer being formed over a substrate and surrounded by a gate spacer that includes a material different from that of the dummy oxide layer;
    rinsing the substrate with a solution containing de-ionized water (DIW) at a second temperature, wherein at least a portion of the reaction product remains after the rinsing;
    after the rinsing, baking the substrate in a chamber, wherein the baking removes the portion of the reaction product thereby forming an opening in the gate spacer.

2. The method of claim 1, wherein the rinsing step includes:
    drying the substrate with one of: a spin drying process and an isopropyl alcohol (IPA) drying process.

3. The method of claim 1, wherein the baking of the substrate is performed at a third temperature higher than the first and second temperatures.

4. The method of claim 1, further comprising:
    forming a gate stack having a high-k dielectric layer and a metal gate electrode, the gate stack at least partially occupying the opening.

5. The method of claim 3, wherein the first temperature ranges from 20° C. to 70° C., the second temperature ranges from 20° C. to 80° C., and the third temperature ranges from 90° C. to 200° C.

6. The method of claim 1, wherein the exposing step, the rinsing step, and the baking step are each performed in a respective one of three chambers in a cluster tool.

7. The method of claim 1, wherein the baking step is accompanied with a flow of an inert gas over the substrate.

8. The method of claim 1, wherein the solution has a pH value ranging from 3 to 7.

9. The method of claim 1, wherein the solution includes DIW and one of: carbon dioxide ($CO_2$), diluted hydrochloric acid (HCl), and diluted citric acid.

10. The method of claim 1, wherein the fluorine-containing compound comprises HF or $NF_3$.

11. A method of forming a semiconductor device, comprising:

providing a substrate, wherein the substrate includes a dummy oxide layer and a nitrogen-containing dielectric layer surrounding the dummy oxide layer;

exposing the dummy oxide layer to a vapor mixture comprising $NH_3$ and a fluorine-containing compound at a first temperature thereby converting the dummy oxide layer to a reaction product;

rinsing the substrate with a solution containing de-ionized water (DIW) at a second temperature to partially remove the reaction product from the substrate; and heating the substrate to a third temperature higher than the first and second temperatures to cause sublimation of remaining portions of the reaction product thereby forming an opening in the nitrogen-containing dielectric layer.

12. The method of claim 11, further comprising, before the heating step:

drying the substrate with one of: a spin drying process and an isopropyl alcohol (IPA) drying process.

13. The method of claim 11, further comprising:

flowing an inert carrier gas over the substrate after the substrate is heated to the third temperature.

14. The method of claim 11, wherein the heating the substrate is performed at a pressure ranging from 10 mTorr to 25 mTorr.

15. The method of claim 11, wherein the solution is DIW, or DIW with one of: carbon dioxide ($CO_2$), diluted hydrochloric acid (HCl), and diluted citric acid.

16. The method of claim 11, wherein:

the vapor mixture comprises $NH_3$ and HF at a ratio of $NH_3$ to HF between 0.1 to 10 by volume.

17. The method of claim 11, wherein:

the vapor mixture comprises $NH_3$ and $NF_3$ at a ratio of $NH_3$ to $NF_3$ between 0.5 to 5 by volume.

18. A method of forming a semiconductor device, comprising:

forming a gate structure over a substrate, wherein the gate structure includes a dummy oxide layer, a dummy gate electrode layer over the dummy oxide layer, and a nitrogen-containing dielectric layer surrounding the dummy oxide layer and the dummy gate electrode layer;

removing the dummy gate electrode layer thereby exposing the dummy oxide layer;

exposing the dummy oxide layer to a vapor mixture comprising $NH_3$ and a fluorine-containing compound at a first temperature, thereby converting the dummy oxide layer to a reaction product;

rinsing the substrate with a solution containing de-ionized water (DIW) at a second temperature to reduce a density of the reaction product;

after the rinsing, heating the substrate to a third temperature higher than the first and second temperatures to remove the reaction product from the substrate, thereby forming an opening in the nitrogen-containing dielectric layer; and forming a gate stack, the gate stack at least partially occupying the opening.

19. The method of claim 18, wherein a ratio of removal rates by using the vapor mixture of the dummy oxide layer and the nitrogen-containing dielectric layer is greater than 2.

20. The method of claim 18, wherein a ratio of removal rates by using the vapor mixture of the dummy oxide layer and the substrate is greater than 100.

* * * * *